(12) United States Patent
McLaury

(10) Patent No.: US 9,542,993 B2
(45) Date of Patent: Jan. 10, 2017

(54) LEAKAGE-CURRENT ABATEMENT CIRCUITRY FOR MEMORY ARRAYS

(71) Applicant: Lattice Semiconductor Corporation, Hillsboro, OR (US)

(72) Inventor: Loren McLaury, Hillsboro, OR (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 14/887,210

(22) Filed: Oct. 19, 2015

(65) Prior Publication Data

US 2016/0099045 A1 Apr. 7, 2016

Related U.S. Application Data

(63) Continuation of application No. 13/777,243, filed on Feb. 26, 2013, now Pat. No. 9,191,022.

(Continued)

(51) Int. Cl.
| | |
|---|---|
| G11C 11/00 | (2006.01) |
| G11C 11/413 | (2006.01) |
| H04L 12/801 | (2013.01) |
| H04L 25/02 | (2006.01) |
| H04L 12/24 | (2006.01) |
| G01R 31/3185 | (2006.01) |
| H03M 1/00 | (2006.01) |
| H03M 1/34 | (2006.01) |
| G11C 16/24 | (2006.01) |
| G11C 17/16 | (2006.01) |

(Continued)

(52) U.S. Cl.
CPC ..... *G11C 11/413* (2013.01); *G01R 31/318597* (2013.01); *G11C 16/24* (2013.01); *G11C 17/16* (2013.01); *H01L 23/49838* (2013.01); *H03M 1/001* (2013.01); *H03M 1/34* (2013.01); *H04L 25/0262* (2013.01); *H04L 41/0806* (2013.01); *H04L 47/10* (2013.01); *H01L 23/49816* (2013.01); *H01L 23/49822* (2013.01); *H01L 23/50* (2013.01); *H01L 23/60* (2013.01); *H01L 2224/16225* (2013.01); *H01L 2224/32225* (2013.01); *H01L 2224/73204* (2013.01); *H01L 2924/13091* (2013.01); *H01L 2924/15311* (2013.01)

(58) Field of Classification Search
USPC ........................................... 365/154
See application file for complete search history.

(56) References Cited

U.S. PATENT DOCUMENTS

| | | | | |
|---|---|---|---|---|
| 5,623,444 | A * | 4/1997 | Gotou | G11C 7/18 365/185.23 |
| 2005/0068832 | A1* | 3/2005 | Andoh | G11O 5/147 365/222 |
| 2012/0206987 | A1* | 8/2012 | Dreesen | G11C 7/12 365/203 |

* cited by examiner

*Primary Examiner* — Anthan Tran
(74) *Attorney, Agent, or Firm* — Haynes and Boone, LLP

(57) ABSTRACT

In one memory array embodiment, in order to compensate for bit-line leakage currents by OFF-state bit-cell access devices, a leakage-current reference circuit tracks access-device leakage current over different process, voltage, and temperature (PVT) conditions to generate a leakage-current reference voltage that drives a different leakage-current abatement device connected to each different bit-line to inject currents into the bit-lines to compensate for the corresponding leakage currents. In one implementation, the leakage-current reference circuit has a device that mimics the leakage of each access device configured in a current mirror that drives the resulting leakage-current reference voltage to the different leakage-current abatement devices.

17 Claims, 4 Drawing Sheets

Related U.S. Application Data

(60) Provisional application No. 61/714,636, filed on Oct. 16, 2012.

(51) Int. Cl.
*H01L 23/498* (2006.01)
*H01L 23/50* (2006.01)
*H01L 23/60* (2006.01)

100

300

LEAKAGE-CURRENT ABATEMENT CIRCUITRY FOR MEMORY ARRAYS

CROSS-REFERENCE TO RELATED APPLICATIONS

This application is a continuation of U.S. patent application Ser. No. 13/777,243, filed on Feb. 26, 2013, which claims benefit of the priority from U.S. provisional application No. 61/714,636, filed on Oct. 16, 2012, the teachings of both are incorporated herein by reference in their entirety.

TECHNICAL FIELD

The present invention relates to electronics, and, more specifically but not exclusively, to memory arrays.

BACKGROUND

This section introduces aspects that may help facilitate a better understanding of the invention. Accordingly, the statements of this section are to be read in this light and are not to be understood as admissions about what is prior art or what is not prior art.

Conventional memory devices have arrays of bit-cells arranged in rows and columns, where each row of bit-cells is accessed via a word line and each column of bit-cells is accessed via one or more bit-lines. Conventional bit-cells tend to leak current into their bit-lines. If the magnitude of the cumulative leakage is too great for a specified number of bit-cells in a column, then the column is typically divided into sub-columns separated by repeater circuits that compensate for the leakage. The use of repeater circuits increases the cost and complexity of memory devices. In addition, the provision of dedicated data write circuitry and data read circuitry for each sub-column further increases the cost and complexity of memory devices.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Figure 1:
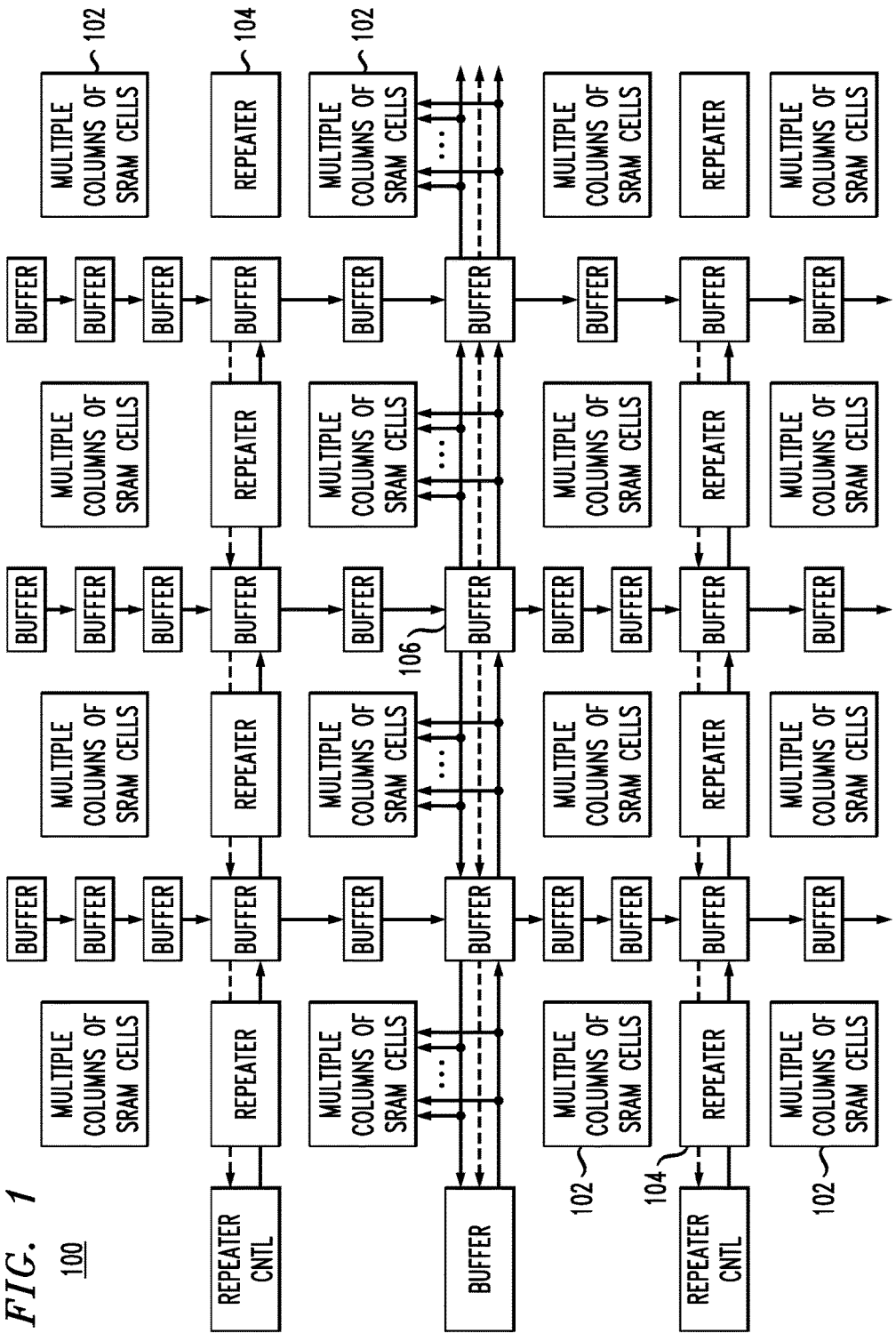
FIG. 1 shows a high-level block diagram of a memory array for an SRAM device.

FIG. 1 shows a high-level block diagram of a memory array 100 for an SRAM (static random access memory) device. Memory array 100 comprises a number of different sub-arrays 102, each having multiple rows and multiple columns of SRAM bit-cells (not explicitly shown). Also shown in FIG. 1 are repeater circuits 104 located between pairs of vertically adjacent sub-arrays 102. At the center of memory array 100 is a block 106, which contains, among other circuitry, a bit-line leakage-current reference circuit, which is described further below with respect to FIG. 3.

Figure 2:
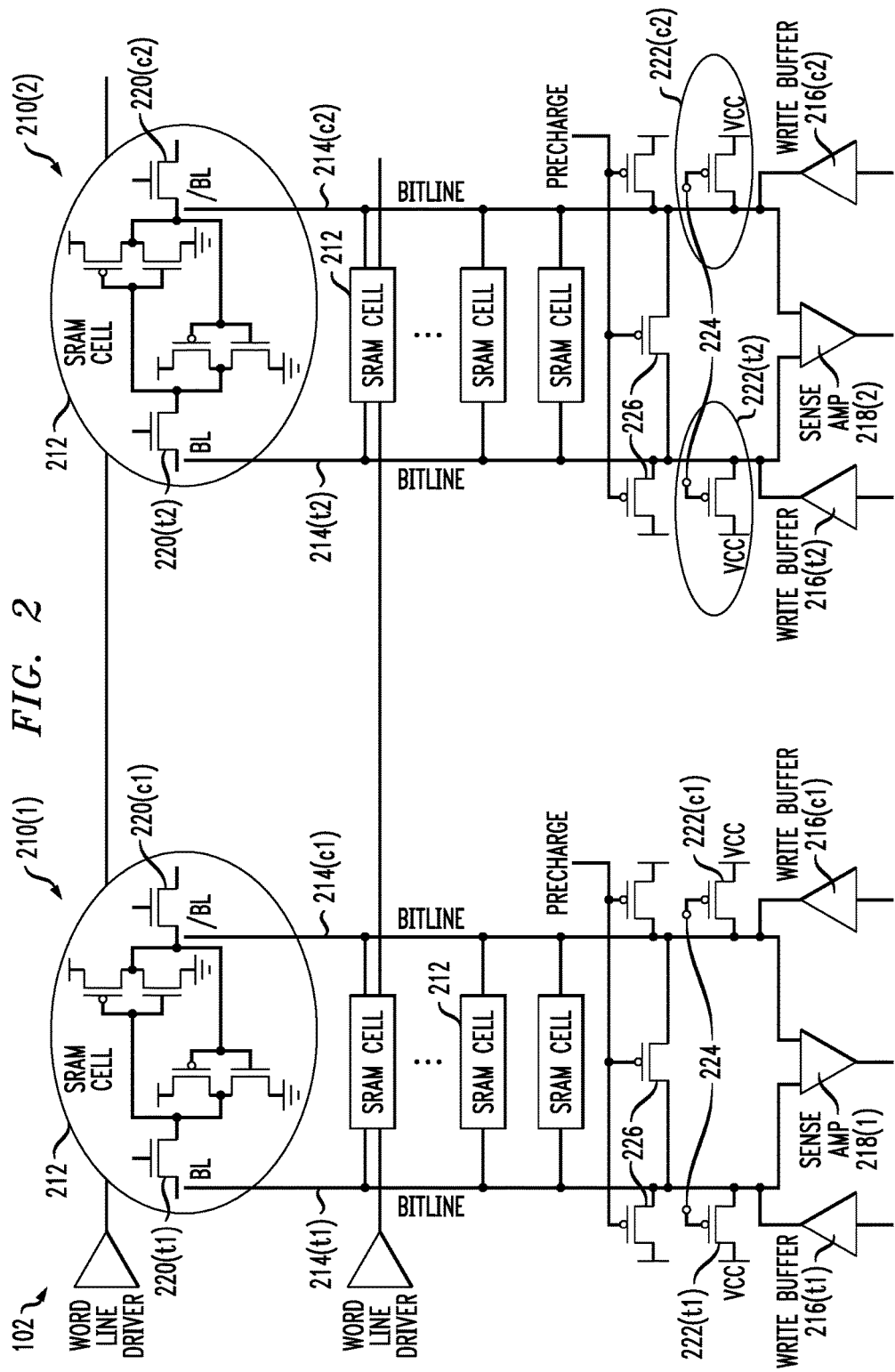
FIG. 2 shows a schematic block diagram of a portion of one sub-array in the memory array of FIG. 1.

FIG. 2 shows a schematic block diagram of a portion of one sub-array 102 in memory array 100 and a portion of the corresponding repeater 104 of FIG. 1, where write circuits 216, read circuits 218, leakage abatement devices 222, and precharge devices 226 are part of repeater 104. In particular, FIG. 2 shows two columns 210(1) and 210(2) of bit-cells 212, each column 210(i) having a true bit-line 214(ti) and a corresponding complement bit-line 214(ct) as well as corresponding true and complement data-path write circuits 216(ti) and 216(ci) and a differential data-path read circuit 218(i). Each bit-cell 212 in column 210(i) has a true access device 220(t) connected to the corresponding true bit-line 214(ti) and a complement access device 220(c) connected to the corresponding complement bit-line 214(ci).

Connected between each bit-line 214 and the power supply voltage (e.g., VCC) is a corresponding bit-line leakage-current abatement device 222. In the implementation of FIG. 2, abatement device 222 is a P-type (e.g., PMOS) transistor, whose gate is connected to receive a leakage-current reference voltage 224 generated by the bit-line leakage-current reference circuit of FIG. 3. Each abatement device 222 injects a current into its corresponding bit-line 214 to compensate for the cumulative leakage currents of the corresponding bit-cell access devices 220 connected to that bit-line.

Although FIG. 2 shows only two columns of bit-cells, those skilled in the art will understand that sub-arrays will typically have more than two columns, e.g., 32, 64, 128, or more columns. Although embodiment of FIG. 2 has true and complement bit-lines for differential signaling, in alternative embodiments, each column may have only a single bit-line for single-ended signaling.

Figure 3:
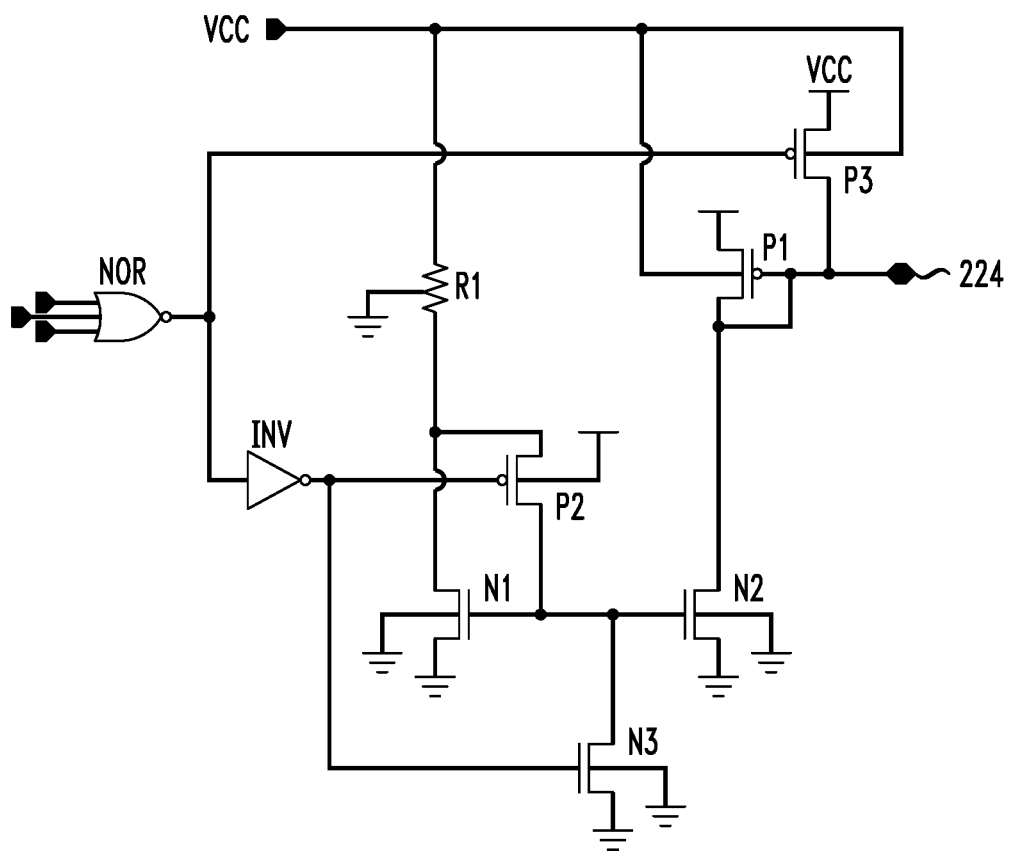
FIG. 3 shows a schematic block diagram of the bit-line leakage-current reference circuit that is part of the memory array of FIG. 1.

FIG. 3 shows a schematic block diagram of bit-line leakage-current reference circuit 300, which is part of block 106 in memory array 100 of FIG. 1. Leakage-current reference circuit 300 is designed to generate suitable levels of leakage-current reference voltage 224 for different PVT (process, voltage, temperature) conditions to enable the various abatement devices 222 in memory array 100 to abate leakage current in each bit-line 214. For a given bit-cell architecture, leakage-current reference circuit 300 reduces the negative effects of bit-line leakage current. For a given overall memory array size, this result can be exploited by configuring more rows of bit-cells in each sub-array and thereby deploying fewer repeater circuits and fewer data-path write and read circuits in the memory array.

N-type transistor device N1 is used to track the leakage of the bit-cell access devices 220, in such a fashion as to match this leakage at an optimum point for maximum bit-line signal development, (which will be discussed in detail with respect to FIG. 4). In certain implementations, leakage-tracking device N1 is constructed of the same type of transistor as the true and complement access devices 220 of each bit-cell 212 of FIG. 2. In addition, in certain implementations, the length of device N1 is designed to match the length of the access devices 220, such that device N1 will track the OFF-state current characteristic of the access devices.

Resistor device R1 is used to modulate the drain-to-source voltage (Vds) sensitivity of device N1 in such a fashion as to match the actual final bias conditions of the voltage condition of bit-lines 214 when sensing bits for a read-back signal. In certain implementations, bit-lines 214 may be allowed to leak down from a pre-charged VCC level by about 300-600 mV depending on the temperature and process corner condition, leaving only a partial amount of Vds across the access devices 220 for leakage bias. In a similar fashion, resistor R1 can be used to modulate the Vds condition on device N1 to match the bias condition that exists on the access devices 220. This approach effectively results in a reference circuit that tracks the drain induced barrier lowering (DIBL) component of the leakage behavior of the access devices 220.

N-type transistor device N2 is used in conjunction with device N1 to create an effective current mirror construct of the current that flows through device N1. In certain implementations, the length of device N2 is the same as the length of device N1, but the width of device N2 is much larger than the width of device N1, e.g., about 100 times larger. This is done to form an overall leakage reference block which is of a much lower impedance, such that the effective Thevenin impedance of the reference is low enough to mitigate noise coupling effects from stray capacitances to its output node.

P-type transistor device P1 translates the current in device N2 into leakage-current reference voltage 224 of FIG. 2, which is the output of the leakage-current reference circuit 300 that is sent to the bit-line leakage-current abatement devices 222 at each read circuit 218 for the accomplishment of leakage abatement. In certain implementations, the length of current-translating device P1 is designed to match the lengths of the P-channel abatement devices 222 of FIG. 2, while the width of device P1 is designed to be about 100 times larger than the width of those P-channel abatement devices. This approach can effectively reduce the output impedance of the overall leakage-current reference circuit 300 by about 100 times (Thevenin equivalent, as described in the previous paragraph). This allows the leakage-current reference voltage 224 to be much more stable as it travels to each data-path read circuit 218. This allows placement of one leakage-current reference circuit 300 for a very large number of bit-cells, e.g., about 10 million bit-cells or more in certain implementations.

P-type transistor device P2 is used to create a short between the drain of device N1 and its gate, which allows the basic current mirror construct to operate as described above. The gate of device P2 is at (ground) voltage VSS to allow the complete coupling of the drain of device N1 to the gate of device N1 when the leakage-current reference circuit 300 is active. Device P2 in conjunction with N-type transistor device N3 and P-type transistor device P3 are used to implement a method of deactivating leakage-current reference circuit 300, which is done to allow the bit-lines 214 to float when not in use. In addition, circuit 300 is deactivated when doing bit writes, which do not require the leakage-current reference voltage 224. The gate of device P2 is driven to VCC potential to turn off the device and isolate the gate and drain of device N1.

The operating modes of leakage-current reference circuit 300 are controlled by the "nor" gate NOR and inverter INV shown in FIG. 3. The following signals are used to drive the nor gate: memory write, float bit-lines, and POR (power up). One or more of these signals can be used to deactivate the leakage reference when not in SRAM read mode.

When activated (ON), device N3 pulls the gates of devices N1 and N2 to VSS when leakage-current reference circuit 300 is deactivated.

Device P3 is used to insure the complete deactivation of the leakage-current reference voltage 224. When device P3 is on with its gate at VSS, leakage-current reference node 224 is coupled to VCC which effectively turns off the P-channel devices in the read circuits 218, and allows the bit-lines 214 to float.

In operation, the output of the NOR gate determines whether leakage-current reference circuit 300 is active (i.e., NOR gate output high, e.g., during read operations) or inactive (i.e., NOR gate output low, e.g., during write operations, power up conditions, and when the SRAM is not in use (float bit-lines)).

When the NOR gate output is high (i.e., leakage-current reference circuit active), devices P3 and N3 are off, and device P2 is on. With device P2 on, the gates of devices N1 and N2 are driven towards VCC through resistor R1, which turn on devices N1 and N2. Turning on device N2 drives the gate of device P1 low, thereby turning on device P1. With devices N1, N2, P1, and P2 on, the current through device N1 is mirrored by the current through device N2, thereby generating leakage-current reference voltage 224 at the gate of device P1.

In general, the greater the current in device N1, the lower the voltage level of leakage-current reference voltage 224, thereby resulting in a greater amount of current injected into each bit-line 214 by its corresponding leakage-current abatement device 222, thereby compensating for the greater accumulated leakage currents in the corresponding bit-cell access devices 220, and vice versa. This same explanation is applicable to both the true and complement bit-lines.

When the NOR gate output is low (i.e., leakage-current reference circuit inactive), devices P3 and N3 are on, and device P2 is off. With device N3 on, the gates of devices N1 and N2 are driven low, thereby turning devices N1 and N2 off. With device P3 on, the gate of device P1 is driven high, thereby turning device P1 off. Moreover, with device P3 on, leakage-current reference voltage 224 is driven high, thereby turning off all of the leakage-current abatement devices 222, such that no compensating current is injected into any bit-lines 214.

The combination of devices N1 and R1 supports a current that tracks the leakage characteristic of the OFF-state access devices 220 across process variation, device-length variation, voltage (VCC) variation, and different temperature characteristics. This approach can allow the data-path read circuits 218 to develop more read signal (e.g., about 4-5 times more signal for some implementations) than existing architectures.

Figure 4:
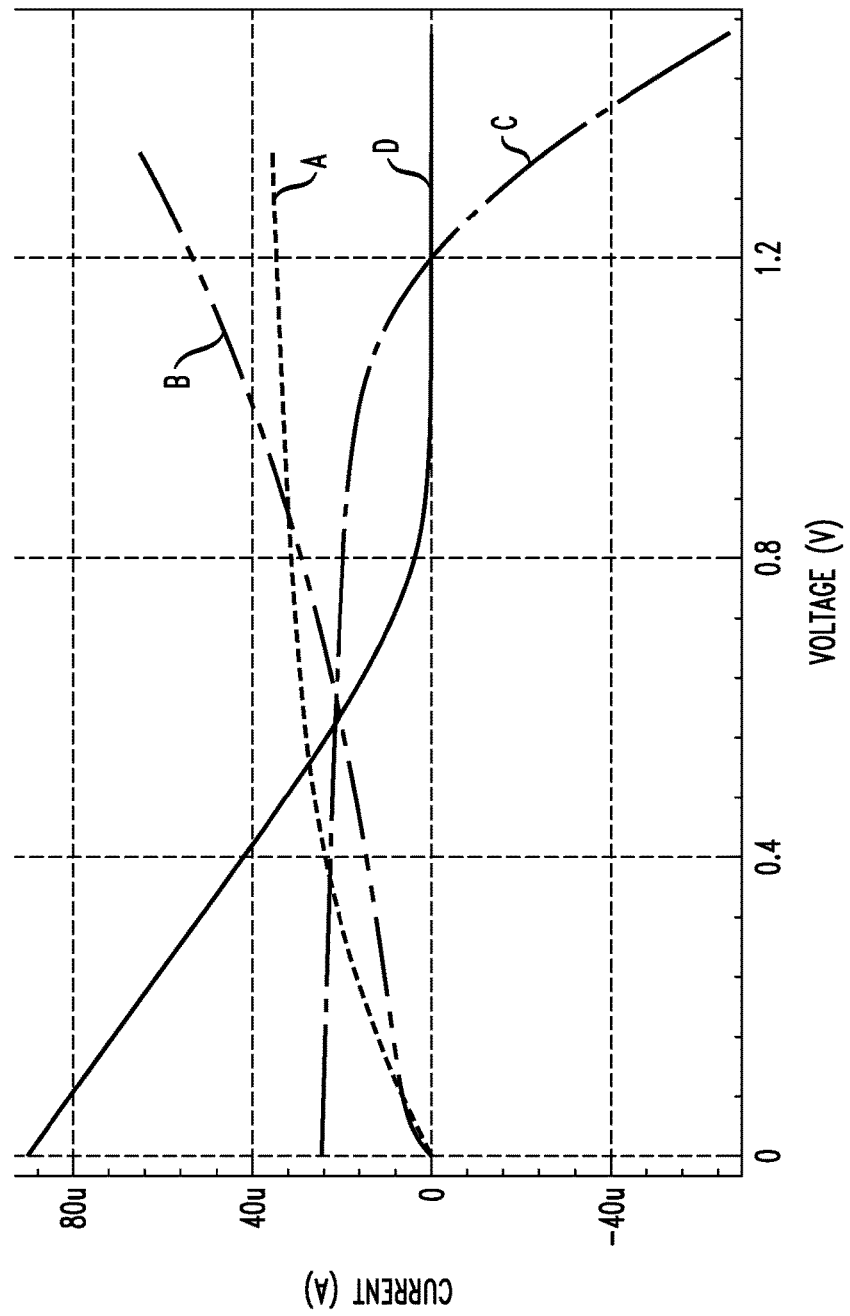
FIG. 4 shows the IV characteristics of the different devices which connect to a given bit-line.

FIG. 4 shows the IV characteristics of the different devices which connect to a given bit-line, where the horizontal axis is the voltage of the bit-line, and the vertical axis is the current that is flowing into or out of the bit-line. There are four IV curves shown in FIG. 4. Curve A shows the memory cell drive current, where the current is 0 uA at 0 volts. As the voltage of the bit-line is ramped toward the VCC (high supply) level of 1.2 volts, the current increases and goes flat line at just under 40 uA. Curve B is the leakage current from non-accessed memory cells on the bit-line. This curve shows an exponential relationship between the current and voltage, where current increases exponentially as the voltage level of the bit-line is increased. Curve C represents the leakage abatement pullup current, which is used to mitigate the leakage current component from the non-accessed memory cells represented by Curve B. As shown in Curve C, this load line goes through 0 current when the voltage of the bit-line is at the VCC level of 1.2 volts. The current-to-voltage relationship matches that of a current mirror approach, and such is the circuit construct. Curve D is the IV characteristic of a prior-art pullup device, which is a diode-connected P-MOS device where the gate is connected to the drain. This load line is also at 0 current at 1.2 volts, and then extends down to about 800 mV (Vt=−400 mV), where it turns up in an expected MOS-diode type of IV characteristic.

As can be seen by the curves, there is an optimum point where the load lines are set to create a maximum voltage difference on a pair of differential bit-lines. By comparing where the load lines cross the memory cell drive and memory cell leakage, it can be seen that the flatter load line of Curve C develops much more signal than the prior-art load line of Curve D. The ratio shown here is about four to one.

In the alternative, this approach can enable an increase in the number of bit-cells on a given bit-line over existing architectures while maintaining the same amount of read signal, e.g., about 4-5 more bit-cells per sub-array for some implementations. Thus, for a memory array of a given size, since each sub-array can be bigger, this approach can be used to reduce the total number of sub-arrays in the array, thereby reducing both the total number of data-path write and read circuits as well as the total number of repeater circuits between vertically adjacent sub-arrays. Depending on the size of the memory array, this approach might even eliminate the need for multiple sub-arrays, at least in the vertical direction as represented in FIG. 1. Thus, it becomes plausible to support many more memory cells with only one placement of the data path interface.

Although the figures show an SRAM memory array having a particular architecture, including a particular bit-cell architecture, those skilled in the art will understand that other embodiments can be SRAM memory arrays having other architectures, including other bit-cell architectures, such as single-ended SRAM memory cells, as well as non-SRAM memory arrays, such as non-volatile memory cells associated with flash memory and anti-fuse memories. Note that, depending on the particular architecture, one or more devices that are P-type devices in one architecture may be implemented using N-type devices in a different architecture, and vice versa.

Although the figures show a memory array having a single leakage-current reference circuit for the entire array, in other implementations, a memory array may have two or more leakage-current reference circuits, each generating a leakage-current reference voltage for a different region of the memory array.

The present invention can be implemented in the context of any suitable type of integrated circuit. device, such as, without limitation, stand-alone memory devices, microprocessor memory, as well as application-specific integrated circuits (ASICs), field-programmable gate arrays (FPGAs), programmable logic devices (PLDs), mask-programmable gate arrays (MPGAs), simple programmable logic devices (SPLDs), and complex programmable logic devices (CPLDs) that have embedded memory.

Also for purposes of this description, the terms "couple," "coupling," "coupled," "connect" "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Also, for purposes of this description, it is understood that all gates are powered from a fixed-voltage power domain (or domains) and ground unless shown otherwise. Accordingly, all digital signals generally have voltages that range from approximately ground potential to that of one of the power domains and transition (slew) quickly. However and unless stated otherwise, ground may be considered a power source having a voltage of approximately zero volts, and a power source having any desired voltage may be substituted for ground. Therefore, all gates may be powered by at least two power sources, with the attendant digital signals therefrom having voltages that range between the approximate voltages of the power sources.

Signals and corresponding nodes or ports may be referred to by the same name and are interchangeable for purposes here.

Transistors are typically shown as single devices for illustrative purposes. However, it is understood by those with skill in the art that transistors will have various sizes (e.g., gate width and length) and characteristics (e.g., threshold voltage, gain, etc.) and may consist of multiple transistors coupled in parallel to get desired electrical characteristics from the combination. Further, the illustrated transistors may be composite transistors.

As used in this specification and claims, the term "output node" refers generically to either the source or drain of a metal-oxide semiconductor (MOS) transistor device (also referred to as a MOSFET), and the term "control node" refers generically to the gate of the MOSFET. Similarly, as used in the claims, the terms "source," "drain," and "gate" should be understood to refer either to the source, drain, and gate of a MOSFET or to the emitter, collector, and base of a bi-polar device when the present invention is implemented using bi-polar transistor technology.

It should be appreciated by those of ordinary skill in the art that any block diagrams herein represent conceptual views of illustrative circuitry embodying the principles of the invention.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

I claim:

1. An integrated circuit comprising
a memory array that comprises:
one or more sub-arrays, each sub-array comprising a plurality of bit-cells, arranged in rows and columns, bit-cells of each column in each sub-array being coupled to least one bit-line;
at least one bit-line leakage-current abatement element coupled with each bit-line and configured to inject a current into the bit-line, responsive to a leakage-current reference; and
a bit-line leakage-current reference circuit comprising a transistor, the bit-line leakage-current reference circuit configured to generate the leakage-current reference based on a current in the transistor and to provide the generated leakage-current reference to the at least one bit-line leakage-current abatement element coupled with the bit-line.

2. The integrated circuit of claim 1, wherein the memory array comprises a respective access device for each bit-line, which has off-state leakage characteristics, and the bit-line leakage-current reference circuit comprises a device having similar leakage characteristics as the off-state leakage characteristics of each respective access device.

3. The integrated circuit of claim 2, wherein the off-state leakage characteristics of each respective access device vary according to variations in fabrication process, operating voltage and temperature change, and the transistor in the bit-line leakage-current reference circuit is configured to track the variation of the off-state leakage characteristics of each respective access device.

4. The integrated circuit of claim 1, wherein the bit-line leakage-current reference circuit comprises a transistor and a device coupled to the transistor, the device configured to modulate drain to source voltage sensitivity of the transistor.

5. The integrated circuit of claim 1, wherein the at least one bit-line leakage-current abatement element comprises a plurality of bit-line leakage-current abatement elements, wherein the bit-line leakage-current reference circuit is shared among the plurality of bit-line leakage-current abatement elements.

6. The integrated circuit of claim 1, further comprising a control element configured to deactivate the bit-line leakage-current reference circuit during operating modes in which the at least one bit-line leakage-current abatement element does not inject current in the at least one bit-line.

7. The integrated circuit of claim 6, wherein the operating modes comprise writes, floating bit lines, power up, and reads, and wherein the at least one bit-line leakage-current abatement element does not inject current in the at least one bit-line during writes, floating bit lines, and power up.

8. The integrated circuit of claim 1, wherein the memory array further comprises activation logic configured to enable the bit-line leakage current reference circuit during a read and disable the bit-line leakage current reference circuit during a write.

9. The integrated circuit of claim 1, wherein the memory array comprises bit lines that are true and complement bitlines, and the at least one bit-line leakage-current abatement element comprises element for both the true and the complement bitlines.

10. The integrated circuit of claim 1, wherein-the memory array comprises a respective access transistor for each bit-line, which has off-state leakage characteristics, the leakage-current reference is a voltage that varies in accordance with leakage experienced across the transistor in the bit-line leakage-current reference circuit.

11. The integrated circuit of claim 1, wherein the bit cells comprise non-volatile memory elements.

12. The integrated circuit of claim 11, wherein the non-volatile memory elements comprise one or more of flash and anti-fuse memory elements.

13. The integrated circuit of claim 1, wherein the bit cells comprise static random access memory elements.

14. The integrated circuit of claim 1, wherein each row in each sub-array of the one or more sub-arrays comprises a respective row access device, wherein the transistor is configured to track
leakage characteristics of each respective row access device across process, voltage and temperature variations, wherein the at least one bit-line leakage-current abatement element comprises a plurality of bit-line leakage-current abatement elements, and wherein the bit-line leakage current reference circuit is shared among the plurality of bit-line leakage-current abatement elements.

15. A method of operating the integrated circuit of claim 1, the method comprising:
activating an access device for a bit cell to be read, so that the bit cell is electrically coupled with a bit line through the access device;
maintaining other rows of bit cells connected to the bit line in an off state, wherein off-state access devices connected to the bit line allow leakage current;
generating a leakage reference by converting a current through a second transistor that matches off-state leakage characteristics of the off-state access devices into a voltage;
providing the leakage reference to devices coupled between a power supply and the at least one bit-line; and
modulating, at the devices coupled between the power supply and the at least one bit-line, an amount of current flowing between the power supply and the at least one bit-line based on the leakage reference.

16. The method of claim 15, wherein the modulating comprises injecting an amount of current into each of the at least one bit-line to at least partially compensate for leakage current of bit cells coupled to the at least one bit line, which are in an off state.

17. The method of claim 15, further comprising modulating a drain to source bias across the second transistor into a voltage in accordance with an amount of pre-charge leak down on a pre-charged bit line, during a read operation.

* * * * *